United States Patent [19]

Jung

[11] 4,371,231
[45] Feb. 1, 1983

[54] ELECTRICALLY CONDUCTIVE CONNECTION OF THE ACTIVE PORTIONS OF AN ELECTRICAL COMPONENT OR OF AN INTEGRATED CIRCUIT TO TERMINALS

[75] Inventor: Albert Jung, Taufkirchen, Fed. Rep. of Germany

[73] Assignee: Siemens Aktiengesellschaft, Berlin and Munich, Fed. Rep. of Germany

[21] Appl. No.: 192,323

[22] Filed: Sep. 29, 1980

[30] Foreign Application Priority Data

Nov. 12, 1979 [DE] Fed. Rep. of Germany ....... 2945670

[51] Int. Cl.³ .............................................. H01R 5/04
[52] U.S. Cl. .......................... 339/275 R; 228/44.1 A
[58] Field of Search ............... 339/17 C, 95 R, 276 R, 339/275 R; 174/84 C, 94 R; 228/44.1 A, 115, 127, 180 A, 243

[56] References Cited

U.S. PATENT DOCUMENTS 3,038,958  6/1962  Swengel ........................... 339/95 R
4,173,388  11/1979  Brandeau .......................... 174/94 R

FOREIGN PATENT DOCUMENTS 1257976  1/1968  Fed. Rep. of Germany .

OTHER PUBLICATIONS

Proceedings of the IEEE, Apr. 1971, pp. 713, 714.
Western Electric Technical Digest, No. 19, Avedissian, 7-1970, p. 7.

Primary Examiner—Joseph H. McGlynn
Attorney, Agent, or Firm—Hill, Van Santen, Steadman, Chiara & Simpson

[57] ABSTRACT

An electrically conductive connection is disclosed for the active parts of an electrical component or of an integrated circuit to terminals for external connection. The connection consists of a very thin gold wire and of a metal layer which are situated on the electrical component or on the integrated circuit. The gold wire is connected to the metal layer by means of thermocompression. The metal layer is provided with perforation holes at least in the area of the nailhead of the gold wire formed due to thermocompression, the perforation holes being provided to improve the contact.

6 Claims, 2 Drawing Figures

ELECTRICALLY CONDUCTIVE CONNECTION OF THE ACTIVE PORTIONS OF AN ELECTRICAL COMPONENT OR OF AN INTEGRATED CIRCUIT TO TERMINALS

BACKGROUND OF THE INVENTION

The invention relates to an electrically conductive connection of the active parts of an electrical component, particularly of a surface wave filter, or of an integrated circuit to terminals for external connection. The electrically conductive connection consists of a very thin gold wire and a metal layer which are situated on the electrical component or on the integrated circuit. The gold wire is connected to the metal layer by means of thermocompression.

The active parts of an electrical component, particularly of a surface wave filter, or of an integrated circuit (usually also referred to as a "chip"), are now electrically connected to the terminals of the exterior connections or to the housing with very fine gold wires (diameter, for example, 25 $\mu$m) by means of thermocompression. This technique represents a generally known and applied technology. The parameters of importance for thermocompression are temperature, pressure and time span of operation. The temperature to which the chip and the terminals are thereby heated generally lies at approximately 350°–400° C. In addition to metallurgical reasons, a high temperature is also necessary for a correspondingly high coefficient of friction between the two metals to be connected, namely, the metal layer designed as a contact spot on the chip or on the component or, respectively, on another contact spot and the gold wire to be connected to the metal layer. Accordingly, the high friction occurs when the wire end which has been melted into a tiny droplet is pressed to the respective contact spot so that a "nailhead" is formed.

In thermocompression, thus it is a matter in a certain sense, of a welding operation which becomes a problem when it is applied given assembly techniques in which a housing of synthetic, for example, of thermoplastic synthetic is employed and/or in which the component or, respectively, the chip is secured by means of adhesive.

Such a method of fastening particularly occurs given surface wave filters which exhibit a substrate of piezoelectric material, for example, mono-crystalline, piezoelectric lithium niobate, in the form of a very thin disk. The filters have an input transducer consisting of a fanned-out metal surface, metal strips on the surface region conditioning the transit time, and at least one output transducer designed in accord with the input transducer on said substrate for generating the surface wave. Surface wave filters of this type, for example, are described in the periodical "Proceedings of the IEEE", April 1971, pages 713/714, incorporated herein by reference. The individual fingers of the input and output transducers are brought together via corresponding lines to contact spots designed as metal layers. These contact spots must be connected to the terminals of external power supplies, which ensues by means of thermocompression, as described above.

The employment of thermocompression for connecting at least two small-surface electrodes disposed next to one another at a small distance on a semiconductor crystal of a semiconductor component to terminal wires by means of cold welding or thermocompression is described, for example, in German No. AS 12 57 976, incorporated herein by reference. Contact spots which are to be electrically connected to one another by means of a fine wire are also present in such semiconductor components or even given integrated circuits upon employment of semiconductor material.

Because of the temperature sensitivity of the housing material and/or of the adhesive, heating to the normally high thermocompression temperature is not possible.

Previously, the method was employed wherein the heat required for the thermocompression was transported to the contacting location via the heated contacting capillary and the gold wire or, respectively, the gold ball. The friction necessary for the welding is generated by means of mechanically or, respectively, electromechanically induced transverse oscillations of the contacting capillary.

SUMMARY OF THE INVENTION

An object of the present invention is to increase the friction between the two materials to be welded to one another, namely, the gold wire and the contacting dot, particularly given lower chip temperatures (at most 200° C.), and to render possible an improved contacting operation in this manner.

For achieving this object, the electrically conductive connection of the type initially specified has the metal layer provided with perforation holes at least in the area of the nailhead of the gold wire formed by means of thermocompression.

With the invention, an additional friction is achieved between the parts to be welded by means of a specific, geometric design of the contact dot on the carrier body.

DESCRIPTION OF THE PREFERRED EMBODIMENTS

With the invention, the hitherto standard surface-wide contact dot is perforated by a multitude of rectangular holes. Due to this structure metallization, the deformation of the gold ball at the end of the gold wire and thus of the ductile material flow is increased in the thermocompression. The reduced coefficient of friction due to oxidation, particularly given aluminum as the material for the contact surface, and/or due to organic or, respectively, inorganic contaminations of the surface of the metallization, results in lessened wettability of the contact surface. With the invention, the coefficient of friction is decisively improved by means of the perforation. The number of micro-welding locations which form under the nailhead occurring as a result of the thermocompression noticeably increases and, thus so does the quality of the contact.

The formation of the contact dot provided with holes can be realized in photolithography for the manufacture of the metal layer without additional expense. It is only in the preparation of the photo mask that the perforation must be taken into consideration.

Figure 1:
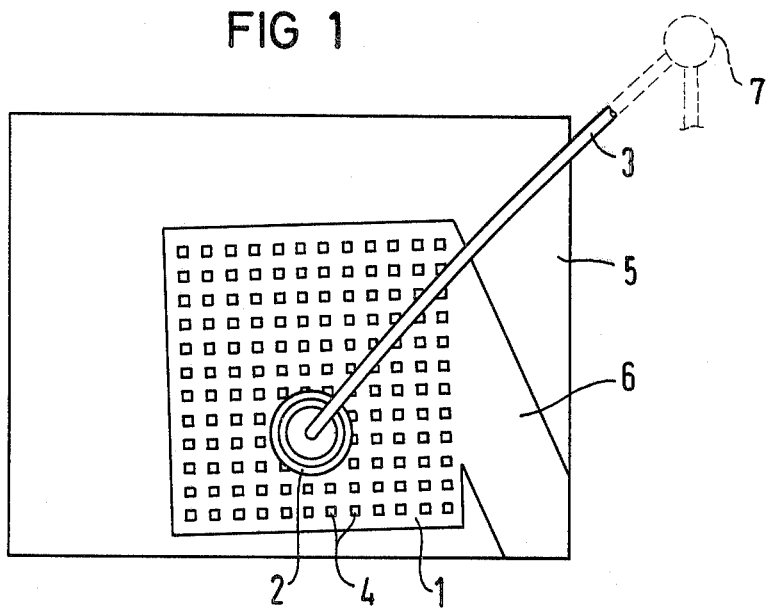
FIG. 1 is a top view of a contact according to the invention.
Figure 2:
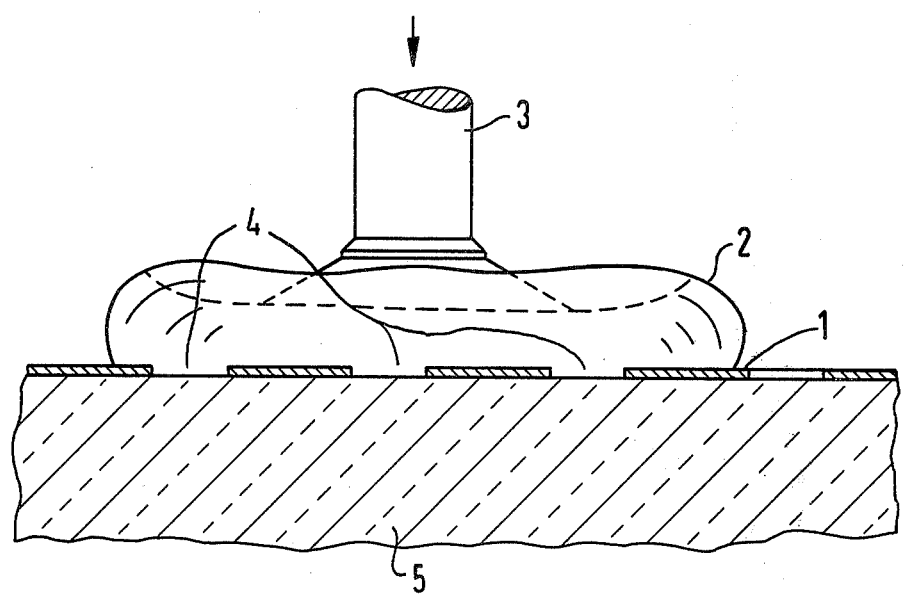
FIG. 2 is an expanded side view of the contact of FIG. 1.

In FIGS. 1 and 2, 5 indicates the carrier body which can be an electrical component, a part of such a component, or a semiconductor body in semiconductor components or in integrated circuits. The contact dot 1 exhibits a plurality of rectangular perforation holes 4, namely at least at the surface area of the carrier body 5 which is situated under the nailhead 2 of the gold wire 3. The path 6 which connects the contact dot 1 to the active part of the component is provided as a current feed. The other end of the gold wire 3 connects to an external terminal 7 shown in dotted lines.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An electrically conductive connection of the active part of a semiconductor layer of an electrical component to a terminal for external connection, comprising, a very thin gold wire having one end connected to the external connection terminal; a metal contact layer having a large group of perforation holes bonded on the semiconductor layer of the electrical component and a contact head at the other end of the gold wire being connected by thermocompression to a portion of the metal layer, the contact head being additionally deformed as a result of deformation into a plurality of said group of perforation holes.

2. The system of claim 1 wherein the contact head comprises an end of the gold wire melted to form a gold ball thermocompressed to the metal layer.

3. An electrical connection system, comprising: a semiconductor layer having a photolithographed metal connection layer thereon and an external connection terminal; one end of a gold wire being connected to the external connection terminal; the other end being connected via an expanded contact head by thermocompression to the metal connection layer at a desired location; and the metal layer having a large plurality of perforations in a field and a plurality of said perforations lying beneath the contact head at which portions of the contact head are additionally deformed.

4. The system of claim 3 wherein the perforations are rectangular and portions of the contact head are deformed therein.

5. An electrical connection system, comprising: a surface wave filter formed of a piezo-electric disc having a metal connection strip bonded thereto and an external connection terminal; one end of a gold wire being connected to the external connection terminal; the other end being connected via an expanded contact head by thermocompression to the metal connection strip at a desired location; and the metal connection strip having a large plurality of perforations in a field and a plurality of said perforations lying beneath the contact head at which portions of the contact head are additionally deformed.

6. The system of claim 5 wherein the perforations are rectangular and portions of the contact head are deformed therein.

* * * * *